United States Patent [19]
Hodges et al.

[11] Patent Number: 6,107,194
[45] Date of Patent: Aug. 22, 2000

[54] METHOD OF FABRICATING AN INTEGRATED CIRCUIT

[75] Inventors: Robert Louis Hodges, Lewisville; Loi Ngoc Nguyen, Carrollton, both of Tex.

[73] Assignee: STMicroelectronics, Inc., Carrollton, Tex.

[21] Appl. No.: 08/900,995

[22] Filed: Jul. 25, 1997

Related U.S. Application Data

[60] Division of application No. 08/486,952, Jun. 7, 1995, which is a continuation-in-part of application No. 08/169,587, Dec. 17, 1993, Pat. No. 5,439,846.

[51] Int. Cl.⁷ ................................................. H01L 21/4763
[52] U.S. Cl. .......................... 438/649; 438/682; 438/683
[58] Field of Search ..................... 438/649, 652, 438/655, 682, 664, 683

[56] References Cited

U.S. PATENT DOCUMENTS

| 4,080,719 | 3/1978 | Wilting . |
| 4,102,733 | 7/1978 | De La Moneda et al. . |

(List continued on next page.)

FOREIGN PATENT DOCUMENTS

| 0 327 412 | of 0000 | European Pat. Off. . |
| 0 523 856 | of 0000 | European Pat. Off. . |
| 0 534 130 | of 0000 | European Pat. Off. . |
| 0071029 | of 0000 | European Pat. Off. . |
| 0111706 | of 0000 | European Pat. Off. . |
| 0265638 | of 0000 | European Pat. Off. . |
| 0491408 | of 0000 | European Pat. Off. . |
| 0 327 412 | of 0000 | France . |

(List continued on next page.)

OTHER PUBLICATIONS

Jones, N.J. et al., "Salicide with buried silicide layer," IBM Technical Disclosure Bulletin, 27(2), Jul. 1984, pp. 1044–1045.

Wolf et al., "Silicon processing for the VLSI era," vol. 1, Lattice Press, 1986, pp. 384–399.

Wolf et al., "Silicon processing for the VLSI era," vol. 2, Process Integration, 1990 Lattice Press, pp. 273–275.

Murarka, S.P., "Silicides for VLSI applications," 1983, Academic Press, pp. 164–167.

H.T.G. Hentzell et al., "Formation of aluminum silicide between two layers of amorphous silicon," Applied Physics Letters, vol. 50, No. 14, pp. 933–934, Apr. 1987.

(List continued on next page.)

*Primary Examiner*—Caridad Everhart
*Attorney, Agent, or Firm*—Theodore E. Galanthay; Lisa K. Jorgenson; Dan Venglarik

[57] ABSTRACT

The present invention provides improved device speed by using two silicides with two different compositions: one silicide is overlaid on a polysilicon gate layer, to form a "polycide" layer with improved sheet resistance, and the other is clad on at least some "active" areas of the monocrystalline silicon, to form a "salicided" active area with improved sheet and contact resistance. Preferably one silicide is a reaction product and the other is deposited.

24 Claims, 6 Drawing Sheets

U.S. PATENT DOCUMENTS

| | | |
|---|---|---|
| 4,128,670 | 12/1978 | Gaebssien . |
| 4,253,907 | 3/1981 | Parry et al. . |
| 4,354,896 | 10/1982 | Hunter et al. . |
| 4,356,623 | 11/1982 | Hunter . |
| 4,384,938 | 5/1983 | Desilets et al. . |
| 4,398,335 | 8/1983 | Lehrer . |
| 4,443,930 | 4/1984 | Hwang et al. . |
| 4,470,189 | 9/1984 | Roberts et al. . |
| 4,543,271 | 9/1985 | Peters . |
| 4,622,735 | 11/1986 | Shibata . |
| 4,654,112 | 3/1987 | Douglas et al. . |
| 4,656,732 | 4/1987 | Teng et al. . |
| 4,657,628 | 4/1987 | Holloway et al. . |
| 4,660,278 | 4/1987 | Teng . |
| 4,675,073 | 6/1987 | Douglas . |
| 4,686,000 | 8/1987 | Heath . |
| 4,707,218 | 11/1987 | Giammarco et al. . |
| 4,715,109 | 12/1987 | Bridges . |
| 4,721,548 | 1/1988 | Morimoto . |
| 4,755,476 | 7/1988 | Bohm et al. . |
| 4,788,160 | 11/1988 | Havemann et al. . |
| 4,792,534 | 12/1988 | Tsuji et al. . |
| 4,801,350 | 1/1989 | Mattox et al. . |
| 4,801,560 | 1/1989 | Wood et al. . |
| 4,810,666 | 3/1989 | Taji . |
| 4,818,335 | 4/1989 | Karnett . |
| 4,824,767 | 4/1989 | Chambers et al. . |
| 4,894,351 | 1/1990 | Batty . |
| 4,912,061 | 3/1990 | Nasr . |
| 4,962,414 | 10/1990 | Liou et al. . |
| 4,986,878 | 1/1991 | Malazgirt et al. . |
| 4,988,423 | 1/1991 | Yamamoto et al. . |
| 4,994,402 | 2/1991 | Chiu . |
| 4,996,167 | 2/1991 | Chen . |
| 5,003,062 | 3/1991 | Yen . |
| 5,027,185 | 6/1991 | Liauh . |
| 5,034,348 | 7/1991 | Hartswick et al. . |
| 5,059,554 | 10/1991 | Spinner et al . |
| 5,061,646 | 10/1991 | Sivan et al. . |
| 5,063,176 | 11/1991 | Lee et al. . |
| 5,110,763 | 5/1992 | Matsumoto . |
| 5,117,273 | 5/1992 | Stark et al. . |
| 5,158,910 | 10/1992 | Cooper et al. . |
| 5,166,088 | 11/1992 | Ueda et al. . |
| 5,174,858 | 12/1992 | Yamamoto et al. . |
| 5,200,808 | 4/1993 | Koyama et al. . |
| 5,214,305 | 5/1993 | Huang et al. . |
| 5,244,841 | 9/1993 | Marks et al. . |
| 5,250,472 | 10/1993 | Chen et al. . |
| 5,254,867 | 10/1993 | Fukuda et al. . |
| 5,256,895 | 10/1993 | Bryant et al. . |
| 5,260,229 | 11/1993 | Hodges et al. . |
| 5,266,516 | 11/1993 | Ho . |
| 5,266,525 | 11/1993 | Morozumi . |
| 5,310,720 | 5/1994 | Shin et al. . |
| 5,320,983 | 6/1994 | Ouellet . |
| 5,323,047 | 6/1994 | Nguyen . |
| 5,380,553 | 1/1995 | Loboda . |
| 5,411,917 | 5/1995 | Forouhi et al. . |
| 5,439,846 | 8/1995 | Nguyen et al. . |

FOREIGN PATENT DOCUMENTS

| | | |
|---|---|---|
| 0 185 787 | of 0000 | Germany . |
| 4 102 422 | of 0000 | Germany . |
| 2-192724 | of 0000 | Japan . |
| 4-092453 | of 0000 | Japan . |
| 5-267477 | of 0000 | Japan . |
| 54-107270 | of 0000 | Japan . |
| 56-164578 | of 0000 | Japan . |
| 58-8846 | of 0000 | Japan . |
| 59-159544 | of 0000 | Japan . |
| 60-58635 | of 0000 | Japan . |
| 61-232646 | of 0000 | Japan . |
| 61-26240 | of 0000 | Japan . |
| 62-106654 | of 0000 | Japan . |
| 63-293946 | of 0000 | Japan . |
| 64-82653 | of 0000 | Japan . |
| 2 083 948 | of 0000 | United Kingdom . |
| 2 106 315 | of 0000 | United Kingdom . |
| 2 167 901 | of 0000 | United Kingdom . |
| 2077993 | of 0000 | United Kingdom . |
| 89/01236 | of 0000 | WIPO . |

OTHER PUBLICATIONS

M. Lin et al., "An environment–insensitive trilayer structure for titanium silicide formation," Journal of Electrochem. Soc., vol. 133, No. 11, pp. 2386–2389, Nov. 1986.

S. Saitoh et al., "Formation of a double–hetero Si/CoSi$_2$/Si structure using molecular beam and solid phase expitaxies," Jap. J. of Applied Physics, vol. 20, pp. 49–54, 1981.

J.K. Howard, "High conductivity transition metal silicide (NbSi$_2$) for FET gate structures," IBM Technical Journal, vol. 22, No. 2, Jul. 1979.

Singer, "A new technology for oxide contact and via etch," Semiconductor Int'l, p. 36 (1993).

Gambino et al., "A Si$_3$N$_4$ etch stop for borderless contacts in 0.25 $\mu$m devices," VMIC Conference, p. 558 (1995).

"Methods of forming small contact holes," IBM Technical Disclosure Bulletin, vol. 30, No. 8 (1988).

"Method to produce sizes in openings in photo images smaller than lithographic minimum size," IBM Technical Disclosure Bulletin, vol. 29, No. 3 (1986).

Ishagaki, et al., "Low parasitic resistance technologies with NES–SAC and SWT–CVD process for low supply voltage, high speed BiCMOS SRAMs," 1994 Symposium on VLSI Technology Digest of Technical Papers, p. 99 (1994).

T. Fukase, et al., "A margin–free contact process using an Al$_2$O$_2$ etch–stop layer for high density devices," IEDM, p. 837 (1992).

Armacos, et al., "Selective oxide/nitride dry etching in a high density plasm reactor," Extended Abstracts, vol. 93–1, Spring Meeting (1993).

Lau, et al., "A super self–aligned source/drain MOSFET," IEDM, p. 358, (1987).

Wehner, et al., "The nature of physical sputtering," Handbook of Thin Film Technology, p. 3–1, McGraw–Hill (1970).

L.M. Ephrath and G.S. Mathad, "Etching–applications and trends of dry etching," in Handbook of Advanced Technology and Computer Systems at 27ff (ed. G. Rabbat 1988).

Device Physics (4 Handbook of Semiconductors) pp. 208–209ff (ed. C. Hilsum 1981).

B. Gorowitz and R. Saia, "Reactive ion etching," in 8 VLSI Electronics at 297ff (ed. N. Einspruch and D. Brown 1984).

A. Schiltz, "Advantages of using spin on glass layer in interconnection dielectric planarization" Microelectronic Engineering, vol. 5, pp. 413–421 (1986).

S. Ghandhi, VLSI Fabrication Principles, Wiley.

Patent Abstracts of Japan, vol. 10, No. 103 (E–398, Apr. 23, 1986 and JP–A–60 246 675 Seiko Denshi Kogyo K.K.), Dec. 6, 1985.

Patent Abstracts of Japan, vol. 17, No. 401 (E–1404, Jul. 27, 1993, and JP–A–05 074 958 NEC Corp.) Mar. 26, 1993.

Patent Abstracts of Japan, vol. 16, No. 526 (E–1286, Oct. 28, 1992, and JP–A–04 196 486 Toshiba Corp.) Jul. 16, 1992.

"Plasma etch anisotropy," J. Electrochem. Soc.: Solid–State Science & Technology, C.B. Zarowin, May 1983, pp. 1144–1152.

J. Electrochem. Soc., vol. 139, No. 2, Feb. 1992, "Polysilicon planarization using spin–on glass," S. Ramaswami & A. Nagy, pp. 591, 599.

J. Electrochem. Soc., vol. 139, No. 2, Feb. 1992, "Three low Dt options for planarizing the premetal dielectric on an advanced double poly BiCMOS process," by W. Dauksher, M. Miller and C. Tracy, pp. 532–536.

J. Electrochem. Soc., vol. 140, No. 4, Feb. 1993, "The effect of plasma cure temperature on spin–on glass," by H. Namatsu and K. Minegishi, pp. 1121–1125.

IEEE Electron Device Letters, vol. 12, No. 3, Mar. 1991, "Hot–carrier aging of the MOS transistor in the presence of spin–on glass as the interlevel dielectric," N. Lifshitz and G. Smolinsky, pp. 140–142.

Journal of Electrochemical Society, vol. 138, No. 10, Oct. 1991, Manchester, New Hampshire, U.S., pp. 3019–3024, K. Fujino et al., "Doped silicon oxide deposition by atmospheric pressure and low temperature chemical vapor deposition using tetraethoxysilane and ozone".

Patent Abstracts of Japan, vol. 11, No. 77 (E–487, Mar. 1987, and JP–A–61 232 646 NEC Corp.) Oct. 16, 1986.

Patent Abstracts of Japan, vol. 16, No. 318 (E–1232, Jul. 13, 1992, and JP–A–40 92 453 Seiko Epson Corp.) Mar. 25, 1992.

Patent Abstracts of Japan, vol. 15, No. 348 (E–1107, Sep. 4, 1991, and JP–A–31 33 131 Mitsubishi Electric Corp.) Jun. 6, 1991.

Proceedings of the International Devices Meeting, Washington, Dec. 5–8, 1993, Dec. 5, 1993, Institute of Electrical and Electronics Engineers, pp. 441–444, Surbanna S. et al., "A novel borderless contact/interconnect technology using aluminum oxide etch stop for high performance SRAM and logic".

IBM Technical Disclosure Bulletin, vol. 32, No. 4A, Sep. 1989, New York, USA, pp.344–345, "Method for reducing the diffusion contact borders".

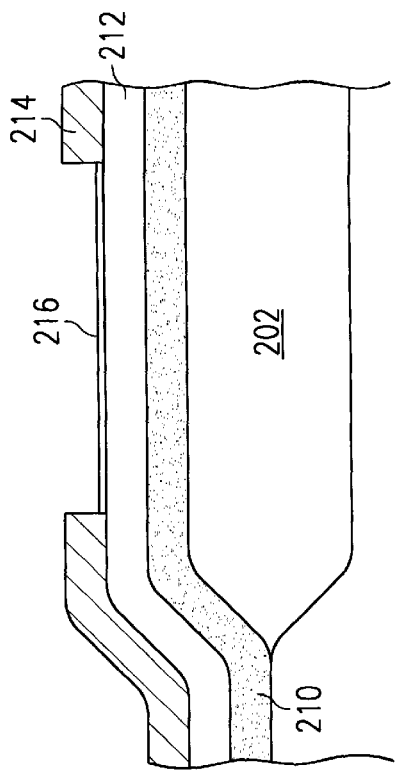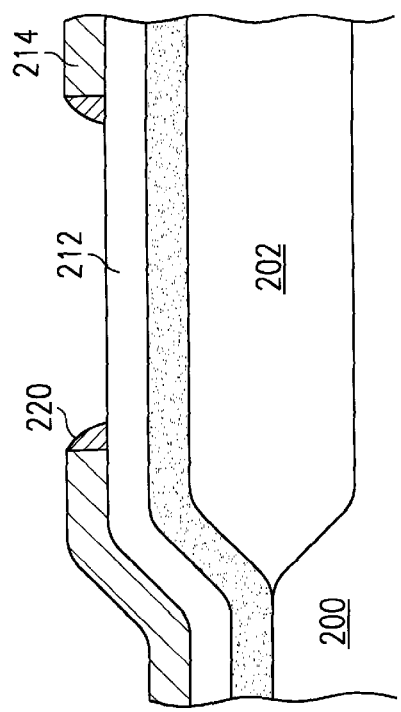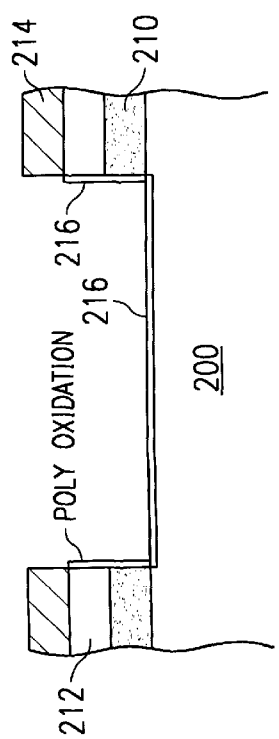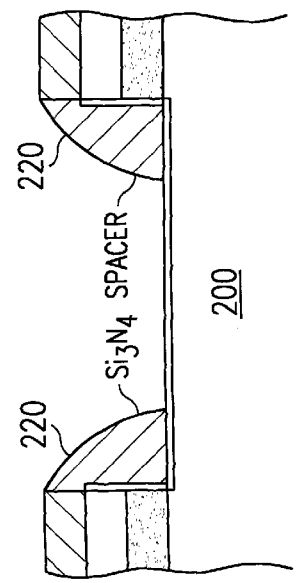

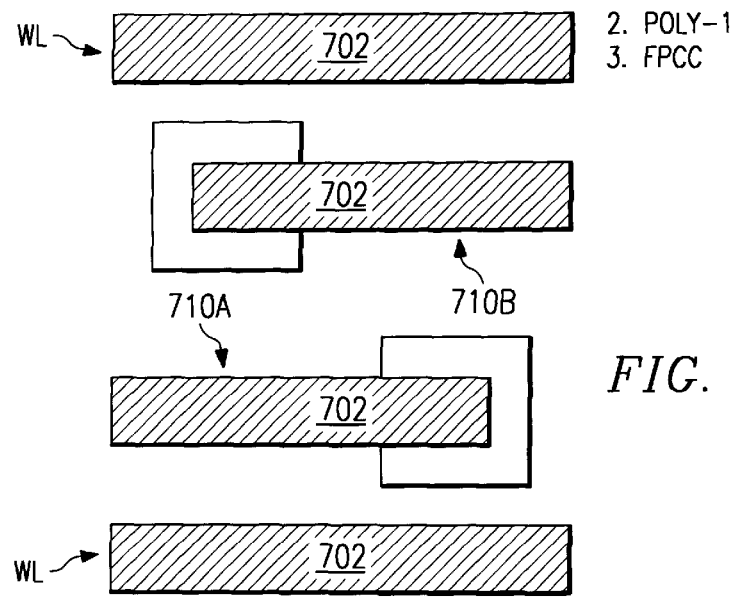
FIG. 7B
FIG. 7C
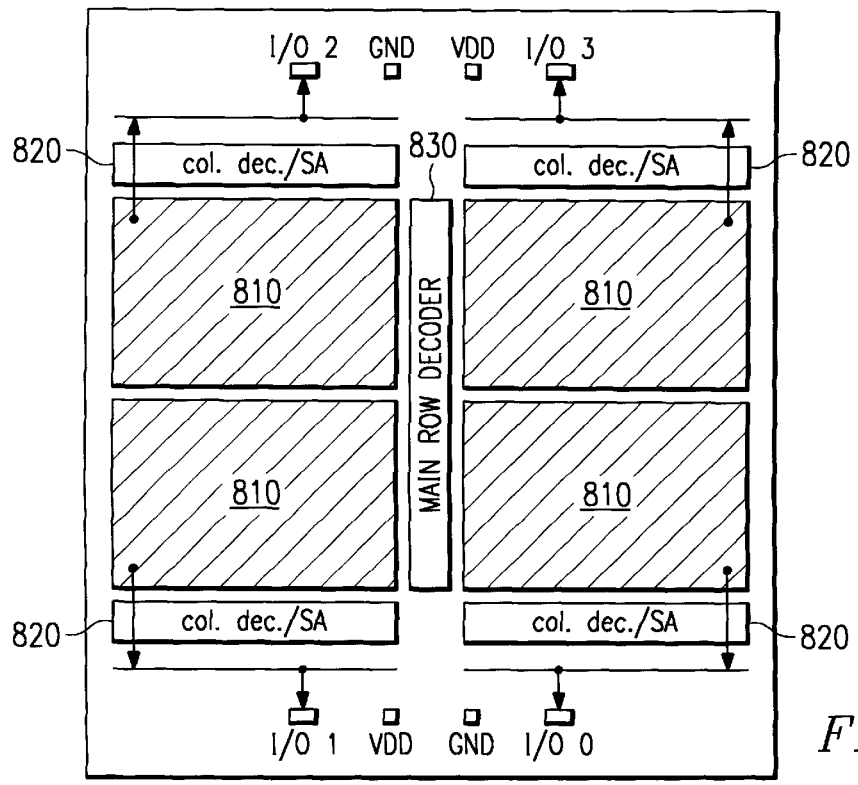
FIG. 8

METHOD OF FABRICATING AN INTEGRATED CIRCUIT

CROSS-REFERENCE TO RELATED APPLICATION

This is a Division of application Ser. No. 08/486,952, filed Jun. 7, 1995, which is a continuation-in-part of application Ser. No. 08/169,587, filed Dec. 17, 1993, now U.S. Pat. No. 5,439,846, issued on Aug. 8, 1995.

BACKGROUND AND SUMMARY OF THE INVENTION

The present application relates to device structures and fabrication processes for high-density integrated circuits.

SHEET RESISTANCE AND CLOCK SPEED

The patterned thin-film layers which are used for conduction in integrated circuit devices will typically have a very significant distributed resistance and capacitance, which imposed a significant time constant on signals routed through such layers.

The RC time constant of the gate can be reduced by making metal contact to the gate in more places. This effectively reduces the "R" term in the time constant. However, each such contact consumes some gate area. Moreover, in single-level-metal processes, the requirements of making source contacts severely constrain the possible geometries for gate contacts.

SILICIDES AND CONDUCTIVE NITRIDES

One general technique for improving the conductivity of silicon and polysilicon layers is to clad them with a metal silicide and/or a conductive nitride (usually TiN). Many different metal silicides have been proposed for use; among the most common are titanium, cobalt, tantalum, tungsten, nickel, and molybdenum silicide.

One particularly convenient way to provide silicides is to use a self-aligned process, in which a metal is deposited overall and heated to react it with exposed silicon. The unreacted metal can then be stripped off. Such process are known as "saliciding."

Salicidation is not without costs and risks. With shallow source/drain depths, salicidation may lead to increased leakage. The potential problems are reviewed, for example, in S. Wolf, II SILICON PROCESSING FOR THE VLSI ERA at 142–152 (1990). Thus silicidation is often avoided in high-density low-power memories.

INNOVATIVE STRUCTURES AND METHODS

The present invention provides improved device speed by using two silicides with two different compositions: one silicide is overlaid on a polysilicon gate layer, to form a "polycide" layer with improved sheet resistance, and the other is clad on at least some "active" areas of the monocrystalline silicon, to form a "salicided" active area with improved sheet and contact resistance. Preferably one silicide is reacted and the other is deposited.

Both of these techniques are known separately; the surprise is that they are advantageously combined. The use of two different silicides (i.e. silicides of two different metals) permits the characteristics of the two different silicided layers to be separately optimized. By contrast, a common teaching in the prior art has been that a saliciding process could be used to simultaneously clad the gate and the active (source/drain) regions.

The disclosed inventions provide tremendous increases in the speed of the peripheral components, without significantly increasing leakage or degrading density. In a sample embodiment with 1995-era shallow junction depths, the masked salicidation reduces the sheet resistance in the periphery from 60 $\Omega/\square$ (N+ active) and 130 $\Omega/\square$ (P+ active) to about 2.0–2.5 $\Omega/\square$ for either.

BRIEF DESCRIPTION OF THE DRAWING

The disclosed inventions will be described with reference to the accompanying drawings, which show important sample embodiments of the invention and which are incorporated in the specification hereof by reference, wherein:

FIGS. 2A–5A show sequential process steps along section A—A of FIG. 1, and corresponding FIGS. 2B–5B show the same sequence of process steps along section B—B of FIG. 1.

FIGS. 7A–7C are overlaid views of key mask portions of an SRAM cell in which self-aligned salicide cladding is present on diffusions which are used for VSS routing, but is not present on the source/drain diffusions of the transistors of the memory cells.

FIG. 8 is a floor plan of an SRAM chip, in which self-aligned salicide cladding is present on the peripheral transistors, but not on the transistors of the memory cells.

DETAILED DESCRIPTION OF THE PREFERRED EMBODIMENTS

The numerous innovative teachings of the present application will be described with particular reference to the presently preferred embodiment (by way of example, and not of limitation), in which:

In the presently preferred embodiment, the claimed silicidation ideas are used in combination with the nitride and spacer innovations described in the parent application. However, it must be understood that the innovative silicidation ideas are not necessarily tied to this context.

Figure 1:
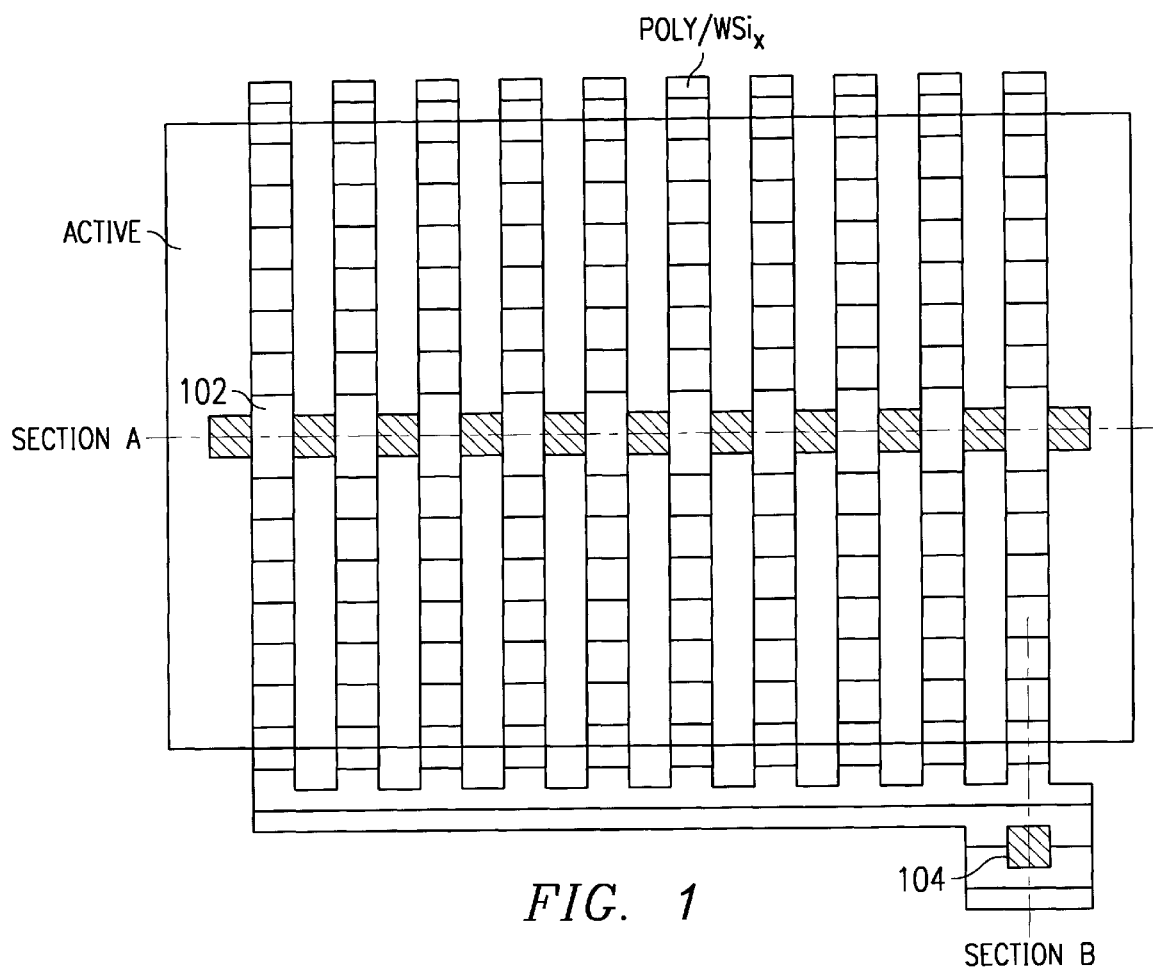
FIG. 1 shows a simple example of an integrated circuit structure.

FIG. 1 shows a simple example of an integrated circuit structure. (As will be recognized by those skilled in the art, this is a simplified example of a device structure, which includes features in common with many high-density structures.) In this structure, a number of transistor locations 102 (i.e. locations where poly crosses over Active) occur along Section line A—A, and a first-poly-contact location 104 where contact is made to poly over field oxide occurs along section line B—B. (Note that these first-poly-contact locations are NOT related to the "first contacts" or direct contacts which were sometimes used, in the 1970s and 1980s, to form contacts directly from first poly to active.) These first-poly-contact locations are shown as mask outline FPCC in FIG. 7B.

Figure 2A:
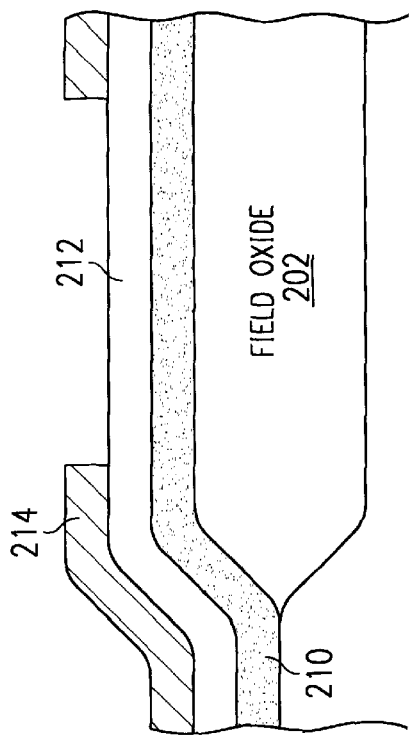
Figure 2B:
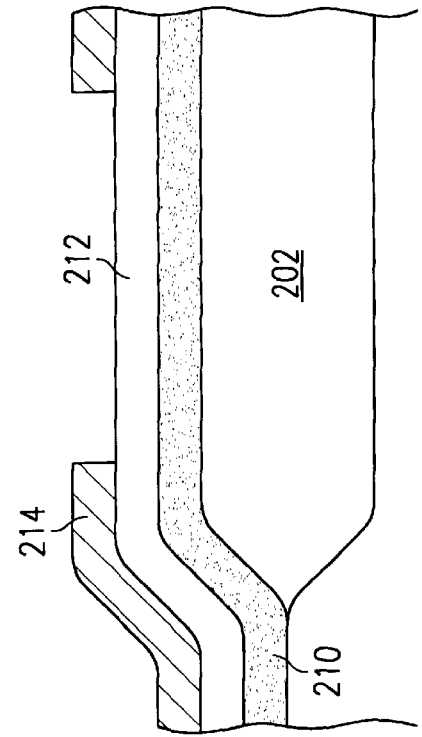
Figure 3A:
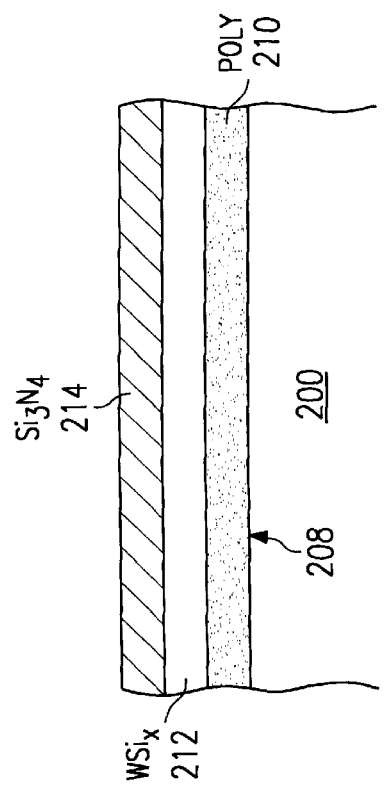
Figure 3B:
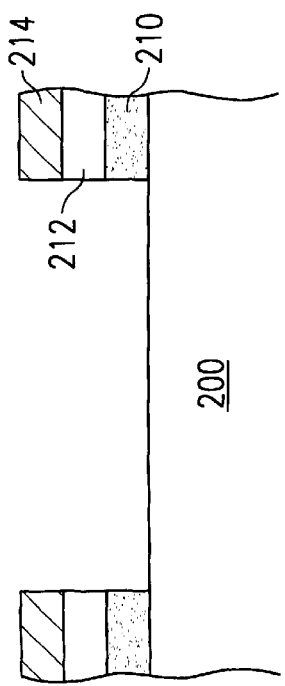

FIGS. 2A, 3A, 4A, etc., show sequential process steps at transistor gate sidewall locations 102 (along section A—A), and corresponding FIGS. 2B, 3B, 4B, etc., show the same sequence of process steps at first-poly-contact location 104 (along section B—B).

In FIG. 2B, note that an additional mask (the "FPC" mask) is used to remove the nitride etch stop in locations where a contact to poly will be required.

After conventional beginnings (preparation of silicon wafer 200, formation of N-wells and P-wells, formation of field oxide 202 to e.g. 5000 Å, sacrificial oxide grown and stripped, gate oxide 203 grown to e.g. 150 Å, threshold voltage adjustment, etc. etc.), fabrication proceeds as follows:

1. Polysilicon 210 is deposited, e.g. to a thickness of 1500 Å, and doped.
2. Tungsten silicide ($WSi_x$) 212 is deposited by chemical vapor deposition (CVD) to a thickness of e.g. 1500 Å. (This polycide combination gives an eventual sheet resistance in the range of 4–5 $\Omega/\square$.)
3. $Si_3N_4$ layer 214 (or another suitable material, e.g. oxynitride, as discussed below) is deposited.
4. The First-poly-contact pattern (the "FPC" mask) is used to etch an opening through the nitride layer 214 in locations where contacts to the clad first-poly layer 210/212 will be formed over field oxide 202.

This results in the structure shown in FIGS. 2A and 2B.

5. The poly-1 mask is now used to pattern the gate polycide layer.

This results in the structure shown in FIGS. 3A and 3B.

6. A re-oxidation step (e.g. 5–30 minutes at a temperature of 800–900° C. in an atmosphere of $H_2O/N_2$ or $O_2/N_2$, in the presently preferred embodiment) is then performed to improve substrate protection. This grows an additional thickness of oxide 216 (e.g. 500 Å) on the exposed portions of the active area, as well as on exposed portions of the polysilicon 210 and silicide 212.

This results in the structure shown in FIGS. 4A and 4B.

7. A conventional LDD implant is then performed. Deep anti-punch-through implants may also be performed at this stage if desired.
8. $Si_3N_4$ is then deposited conformally (e.g. to a thickness of 1500 Å, in the presently preferred embodiment) and etched anisotropically, using an $SF_6+CF_4$ etch chemistry with endpoint detection, to produce sidewall spacers 220. Note that the height of the sidewall spacers 220 on the poly-1 sidewalls is greater than that of the gate polycide structure. Note that smaller spacers 220 also appear on the sidewalls of the FPC aperture, in addition to those on the poly-1 sidewalls.

This results in the structure shown in FIGS. 5A and 5B.

9. Masked n+ and p+ implants are now performed to form source/drain diffusions. The doses and energies are preferably selected to form junction depths of e.g. 0.1 to 0.15 microns for the n+ diffusions, and 15–0.2 microns for the p+ diffusions. In this sample embodiment, the doses and energies are such that the sheet resistance of the unclad diffusions would be about 60 $\Omega/\square$ for n+ and 130 $\Omega/\square$ for p+; but the clad diffusions have a sheet resistance of about 2.3 $\Omega/\square$ for n+ and about 2.0 $\Omega/\square$ for p+. (Of course these specific parameters can readily be changed as desired.) Conventional annealing is preferably now performed for dopant activation.
10. An oxide masking layer is now deposited overall. The thickness of this layer is not particularly critical, e.g. 100–1000 Å, or more specifically 300 Å in the presently preferred embodiment.
11. Resist is then patterned to expose the oxide mask layer over the periphery, and a plasma fluoro-etch is performed to remove this oxide mask layer from the periphery. The resist is then stripped.
12. An RCA cleanup is then performed (preferably using the formulations known to those skilled in the art as SC1 and SC2, followed by HF).
13. Titanium is then deposited overall, e.g. to a thickness of 400 Å, and, in the presently preferred embodiment, TiN is then deposited thereon by CVD to a thickness of 300 Å.
14. An RTA anneal is then performed (e.g. maintaining a peak temperature of about 730° C. for about 20 sec). This forms titanium silicide 610 over exposed silicon and polysilicon, and TiN over oxide. (Optionally, of course, a furnace anneal can be used instead of the RTA steps.)
15. The TiN is then stripped in an $NH_4OH/H_2O_2/H_2O$ solution.
16. A second RTA anneal is then performed (e.g. maintaining a peak temperature of about 850° C. for about 20 sec). This lowers the sheet resistance of the titanium silicide.

Figure 6:
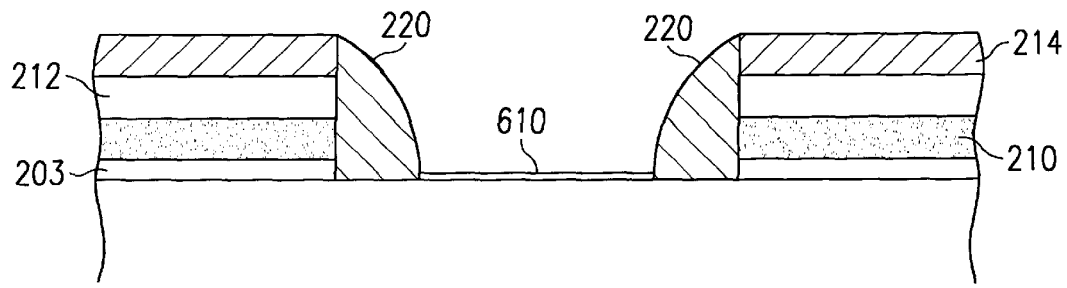
FIG. 6 shows a gate corner structure in a transistor which includes two different silicides: one cladding the active areas, and a different silicide in the gate polycide.

These steps form silicided active areas in the periphery, as illustrated in FIG. 6. Note that two different silicides are present in this device structure: one silicide 610 clads the active areas, and the other silicide 212 is a part of the gate polycide structure. In the preferred embodiment, the first silicide 610 is a titanium silicide (optionally overlaid with TiN), and the second silicide is a tungsten silicide. Preferably the first silicide has a composition of approximately $TiSi_2$, and the second silicide has a composition of approximately $WSi_2$.

Conventional processing now resumes. For example, an interlevel dielectric (e.g. BPSG over undoped silica glass) is now deposited, and is etched using an oxide etch chemistry which is selective to $Si_3N_4$. In the presently preferred embodiment, this performed using a fluoro-etch with sacrificial silicon in the chamber. See Singer, "A New Technology for Oxide Contact and Via Etch", SEMICONDUCTOR INTERNATIONAL, August 1993, p.36, which is hereby incorporated by reference. Metal is now deposited, patterned, and etched to form a desired interconnect pattern. A wide variety of conventional metallization structures may be used, e.g. Al:1% Si:1% Cu, or a Ti/W/Al stack, or other known thin film recipes. Processing may then continue with conventional further steps, e.g. deposition of a further interlevel dielectric and a second metal layer (if desired), contact sinter (if needed), deposition and densification of a protective overcoat and removal thereof to expose contact pad locations. Processing may include additional conventional steps to complete fabrication, e.g. deposition and planarization of further interlevel dielectric, via patterning, second metal deposition and etch, protective overcoat deposition, etching contact pad apertures, etc. etc. See generally, e.g., VLSI TECHNOLOGY (2.ed. Sze 1988); G. Anner, PLANAR PROCESSING PRIMER (1990); R. Castellano, SEMICONDUCTOR DEVICE PROCESSING (1991); W. Runyan & K. Bean, SEMICONDUCTOR INTEGRATED CIRCUIT PROCESSING TECHNOLOGY (1990 ed.); S. Wolf, SILICON PROCESSING FOR THE VLSI ERA (1985, 1990); and the annual proceedings of the IEDM conferences for years 1979 to date; all of which are hereby incorporated by reference.

Figure 7A:
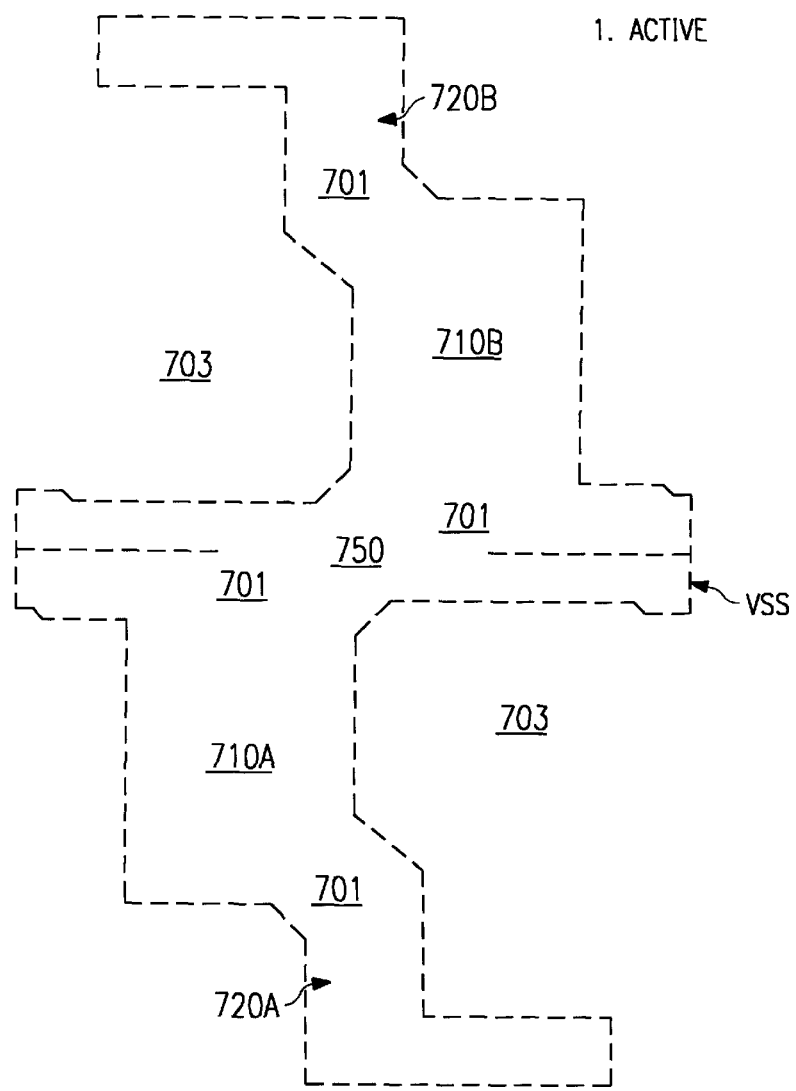

FIGS. 7A–7C are overlaid views of key mask portions of an SRAM cell in which self-aligned salicide cladding is present on diffusions which are used for VSS routing, but is not present on the source/drain diffusions of the transistors of the memory cells. These Figures are all parts of a single drawing, and are drawn to a common scale, but are separated here for clarity.

FIG. 7A shows the active pattern, i.e. the pattern of areas 701 where field oxide 703 is not present, and where transistors can consequently be formed. The sample layout shown is a 4T cell which includes two cross-coupled NMOS driver transistors 710A and 710B, and two NMOS pass transistors 720A and 720B. Note that the long horizontal active portion 750 at the center of the cell is used for routing VSS (ground) through multiple cells, and will be silicided as shown in FIG. 7C. The channel locations of transistors 710A, 710B, 720A, and 720B are also generally indicated.

FIG. 7B shows two additional masks, FPCC and poly-1. The polycide layer 702 provides the gates of transistors 710A, 710B, 720A, and 720B. Portions at top and bottom (marked WL) provide word lines, and gate the pass transistors 720. An n+ implant will dope all of the active areas 701 n+. except where covered by the polysilicon layer 702 (and its sidewall spacers).

FIG. 7C shows the pattern of the active portion 750 which is used for routing VSS (ground) through multiple cells.

Additional structures, not shown, provide cross-connections between the driver transistors 710 and complete the SRAM cell. For example, an additional polysilicon layer provides the resistive loads and the connection to the positive power supply.

FIG. 8 is a floor plan of a 4T SRAM chip, in which self-aligned salicide cladding is present on the peripheral transistors, but not on the transistors of the memory cells. This sample embodiment is a 16M chip which is organized as 4M×4, but of course other organizations can be used. This sample embodiment includes four subarrays 810 (illustrated with hatching) which are protected from the salicidation. Peripheral circuits, such as row decoders 830 and column-decode/sense-amplifier circuitry 820, provide data access to the memory cells.

Figure 9:
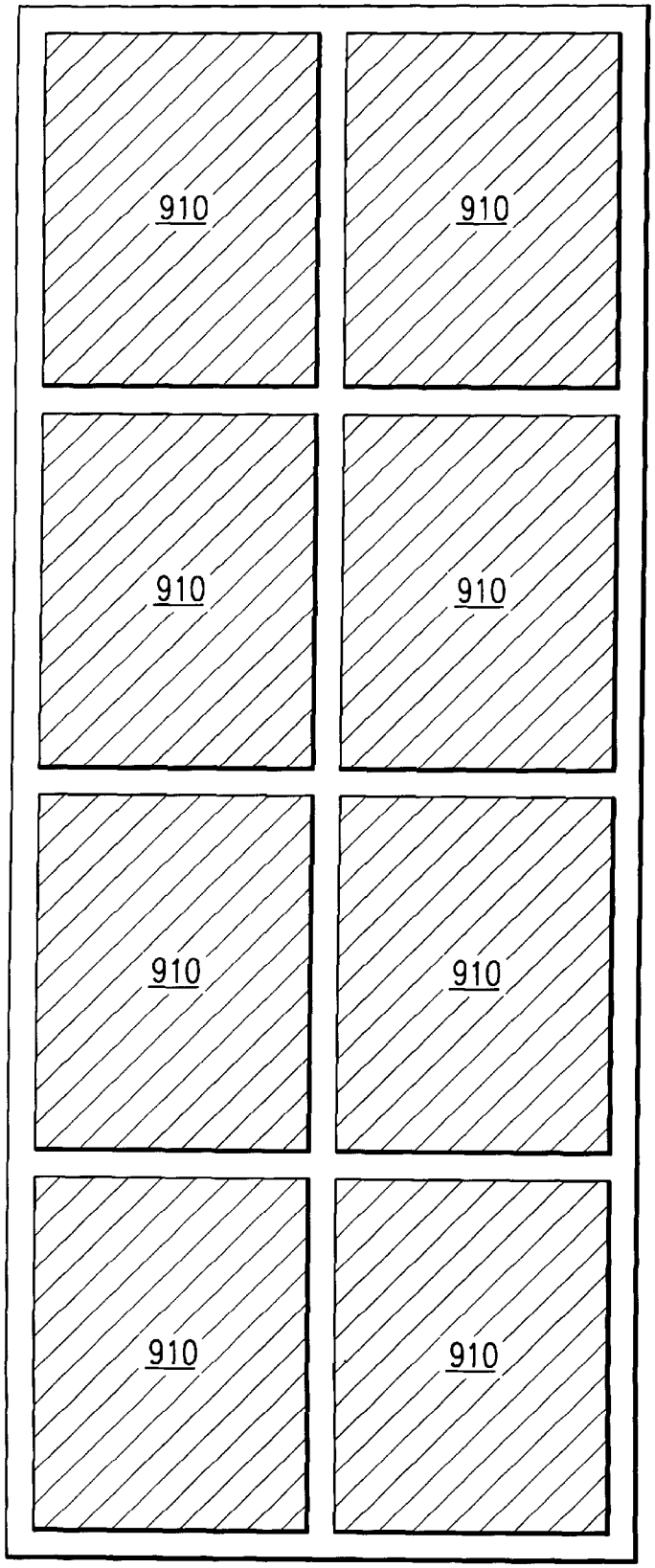
FIG. 9 is a floor plan of a DRAM chip, in which self-aligned salicide cladding is present on the peripheral transistors, but not on the pass transistors of the memory cells.

FIG. 9 is a floor plan of a DRAM chip, in which self-aligned salicide cladding is present on the peripheral transistors, but not on the pass transistors of the memory cells. This sample embodiment includes eight subarrays 910 (illustrated with hatching). Each subarray includes 2M 1T memory cells, and is protected from the salicidation. The peripheral circuits, such as row decoders, column-decoders, sense-amplifiers, input latches, and output buffers, are all conventional and not separately indicated.

According to a disclosed class of innovative embodiments, there is provided: An integrated circuit, comprising: a substrate having monocrystalline semiconductor material in active areas, at a first surface thereof, which are laterally separated by isolation regions; a transistor having at least one gate electrode overlying a portion of at least one said active area; and said gate electrode being cladded with a first silicide composition, and said active area being cladded with a second silicide composition which is different from said first silicide composition.

According to another disclosed class of innovative embodiments, there is provided: An integrated circuit, comprising: a substrate having monocrystalline semiconductor material in active areas, at a first surface thereof, which are laterally separated by isolation regions; a patterned thin-film layer which comprises a layered structure including polysilicon and a first metal silicide, and which is capacitively coupled to a portion of at least one said active area to define an invertible channel region therein; and at least one said active area having some portions thereof coated by a second metal silicide which is different from said first metal silicide and is self-aligned to said patterned thin-film layer.

According to another disclosed class of innovative embodiments, there is provided: An integrated circuit, comprising: a substrate having monocrystalline semiconductor material in active areas, at a first surface thereof, which are laterally separated by isolation regions; a patterned thin-film layer which comprises a layered structure including polysilicon and a first metal silicide, and which is capacitively coupled to a portion of at least one said active area to define an invertible channel region therein; at least one said active area having some portions thereof coated by a second metal silicide which is different from said first metal silicide and is self-aligned to said patterned thin-film layer, and at least one said active area which does not have said second metal silicide.

According to another disclosed class of innovative embodiments, there is provided: A fabrication method, comprising the steps of: a) providing a substrate having monocrystalline semiconductor material in active areas, at a first surface thereof, which are laterally separated by isolation regions; b) forming a patterned thin-film layer overlying and capacitively coupled to a portion of at least one said active area, said layer comprising a first metal silicide overlying polycrystalline layer of a semiconductor material; c) forming self-aligned dielectric spacers along the edges of said thin-film layer; and d) depositing and reacting a metal on some, but not all, ones of said active areas, to form a second metal silicide at the surfaces of said active areas; wherein said first and second metal silicides are compounds of different metals.

According to another disclosed class of innovative embodiments, there is provided: A fabrication method, comprising the steps of: a) providing a substrate having monocrystalline semiconductor material in active areas, at a first surface thereof, which are laterally separated by isolation regions; b) forming a patterned thin-film layer overlying and capacitively coupled to a portion of at least one said active area, said layer comprising a first metal silicide overlying polycrystalline layer of a semiconductor material; c) forming self-aligned dielectric spacers along the edges of said thin-film layer and simultaneously forming said dielectric atop said patterned thin-film layer; and d) depositing and reacting a metal on some, but not all, ones of said active areas, to form a second metal silicide at the surfaces of said active areas; wherein said first and second metal silicides are compounds of different metals.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

Of course, the specific etch chemistries, layer compositions, and layer thicknesses given are merely illustrative, and do not by any means delimit the scope of the claimed inventions.

For example, many of the disclosed innovations are not limited to processes like those of FIGS. 1–5B, nor even to analogous processes, but can be used in a huge variety of integrated circuit processes.

For another example, the sidewall spacers do not necessarily have to be silicon nitride, but in some alternative embodiments can be silicon dioxide or another dielectric.

The invention can also be used with other deposited silicides instead of $TaSi_2$, including for example, without limitation, silicides of tungsten, molybdenum, palladium, platinum, cobalt, nickel, chromium, hafnium, titanium or vanadium.

The invention can also be used with other salicided silicides instead of $TiSi_2$, including for example, without limitation, silicides of cobalt, nickel, or vanadium.

Similarly, the nitride sidewall spacers of the presently preferred embodiment are not strictly necessary to the practice of the invention.

While the inventions have been described with primary reference to a single-poly process, it will be readily recognized that these inventions are equally applicable to double-poly or triple-poly structures and processes.

Similarly, it will be readily recognized that the described process steps can also be embedded into hybrid process flows, such as BiCMOS or smart-power processes.

It should also be understood that the disclosed innovations can be applied to a wide variety of integrated circuits. However, the use of array-masked salicidation is most attractive in battery backed SRAMs (whether 4T, 6T, or with TFT loads).

It should be noted that these innovations can be applied to a wide variety of integrated circuits, and are not limited only to memories.

What is claimed is:

1. A fabrication method, comprising the steps of:

providing a substrate having an active area;

forming a layer overlying a portion of the active area, the layer comprising a first metal silicide overlying a gate dielectric;

depositing and reacting a metal on an exposed surface over a source region within the substrate, but not over a drain region within the substrate, to form a second metal silicide, wherein the first and second metal silicides are compounds of different metals.

2. A fabrication method, comprising the steps of:

providing a substrate having a plurality of active areas;

forming a gate layer overlying each active area, the gate layer comprising a first metal silicide overlying a polysilicon gate electrode and a gate dielectric;

forming self-aligned dielectric spacers along edges of gate layer and simultaneously forming dielectric atop the gate layer; and depositing and reacting a metal on an exposed surface of the substrate adjacent the dielectric spacers in some, but not all, of the active areas to form a second metal silicide over at least one source region of the subtrate, but not over a drain region of the subtrate, wherein the first and second metal silicides are compounds of different metals.

3. The method of claim 1, wherein the step of depositing and reacting a metal to form a second metal silicide further comprises:

depositing and reacting a metal to form titanium silicide.

4. The method of claim 1, wherein the step of providing a substrate having an active area further comprises:

providing a substrate having a plurality of active areas, wherein the active area is located in a periphery of the plurality of active areas.

5. The method of claim 1, wherein the step of forming a layer overlying a portion of the active area further comprises:

forming the layer with a polycide portion formed by reacting tungsten with polysilicon.

6. The method of claim 5 further comprising doping said polycide with an n-type dopant.

7. The method of claim 5 further comprising forming conductive nitride over said patterned layer.

8. The method of claim 5 further comprising forming conductive diffusion-barrier material nitride over said layered structure.

9. The method of claim 5, wherein the step of providing a substrate further comprises:

providing a substrate having a plurality of active areas for devices forming a memory.

10. The method of claim 2, wherein the step of depositing and reacting a metal to form a second metal silicide further comprises:

depositing and reacting a metal to form titanium silicide.

11. The method of claim 2, wherein the step of forming a gate layer overlying each active area further comprises:

forming a tungsten silicide layer over the polysilicon gate electrode and the gate dielectric.

12. The method of claim 2, wherein the step of forming a gate layer overlying each active area further comprises:

forming the layer with a polycide portion formed by reacting tungsten with polysilicon.

13. The method of claim 12, further comprising:

doping the polycide with an n-type dopant.

14. The method of claim 12, further comprising:

forming conductive nitride over the gate layer.

15. The method of claim 12, further comprising:

forming conductive diffusion-barrier material nitride over the gate layer.

16. The method of claim 12, wherein the step of providing a substrate having a plurality of active areas further comprises:

providing a substrate having a plurality of active areas for devices forming a memory, wherein the active areas in which the second metal silicide is formed are located at a periphery of the plurality of active areas.

17. A fabrication method comprising the steps of:

forming a first metal silicide layer over a gate on an active area of a substrate; and depositing and reacting a metal on exposed regions of the substrate in the active area to form a second metal silicide, different than the first metal silicide, over source regions of the substrate, but not over drain regions of the substrate.

18. The method claim 17, wherein the step of depositing and reacting a metal to form a second metal silicide further comprises:

depositing and reacting a metal to form titanium silicide.

19. The method of claim 17, wherein the step of forming a first metal silicide layer further comprises:

forming a tungsten silicide layer over the gate.

20. The method of claim 17, wherein the step of forming a first metal silicide layer further comprises:

forming the layer of polycide.

21. The method of claim 17, further comprising:

doping the polycide with an n-type dopant.

22. The method of claim 21, further comprising:

forming conductive nitride over the first metal silicide layer.

23. The method of claim 21, further comprising:

forming conductive diffusion-barrier material nitride over the first metal silicide layer.

24. The method of claim 21, wherein the step of forming a first metal silicide layer over on an active area of a substrate further comprises:

forming a first metal silicide layer over the gate on the substrate.

* * * * *